(12) United States Patent
Ishii

(10) Patent No.: US 10,242,930 B2
(45) Date of Patent: Mar. 26, 2019

(54) MOLDED RESIN-SEALED POWER SEMICONDUCTOR DEVICE

(71) Applicant: Mitsubishi Electric Corporation, Tokyo (JP)

(72) Inventor: Ryuichi Ishii, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/593,385

(22) Filed: May 12, 2017

(65) Prior Publication Data

US 2018/0096910 A1 Apr. 5, 2018

(30) Foreign Application Priority Data

Oct. 5, 2016 (JP) ................. 2016-196885

(51) Int. Cl.
*H01L 23/36* (2006.01)
*H01L 23/367* (2006.01)
(Continued)

(52) U.S. Cl.
CPC ........ *H01L 23/3675* (2013.01); *H01L 23/293* (2013.01); *H01L 23/3107* (2013.01); *H01L 23/3121* (2013.01); *H01L 23/49524* (2013.01); *H01L 23/49548* (2013.01); *H01L 23/49562* (2013.01); *H01L 23/49575* (2013.01); *H01L 2224/40245* (2013.01); *H01L 2924/181* (2013.01)

(58) Field of Classification Search
CPC ....... H01L 23/29; H01L 23/293; H01L 23/31; H01L 23/312; H01L 23/3121; H01L 23/367; H01L 23/3675; H01L 23/49; H01L 23/495; H01L 23/4954; H01L 23/49548

USPC ......................................... 257/675
See application file for complete search history.

(56) References Cited

U.S. PATENT DOCUMENTS 5,698,899 A * 12/1997 Hirakawa ............. H01L 21/565
257/675
2004/0075169 A1 4/2004 Yamada et al.
(Continued)

FOREIGN PATENT DOCUMENTS

JP 2004-140305 A 5/2004
JP 3740116 B2 2/2006
(Continued)

OTHER PUBLICATIONS

Communication dated Apr. 25, 2017, from the Japanese Patent Office in counterpart Japanese application No. 2016-196885.
(Continued)

*Primary Examiner* — Monica D Harrison
(74) *Attorney, Agent, or Firm* — Sughrue Mion, PLLC; Richard C. Turner

(57) ABSTRACT

Freedom of layout is increased, and a small, low-priced molded resin-sealed power semiconductor device is obtained. A molded resin-sealed power semiconductor device includes a power semiconductor element, a lead frame having a thick portion on which the power semiconductor element is mounted and a thin portion thinner than the thick portion, an inner lead that electrically connects the power semiconductor element and lead frame, and a molded resin that seals the power semiconductor element, lead frame, and inner lead.

6 Claims, 4 Drawing Sheets

(51) Int. Cl.
*H01L 23/29* (2006.01)
*H01L 23/31* (2006.01)
*H01L 23/495* (2006.01)

(56) References Cited

U.S. PATENT DOCUMENTS

| | | | |
|---|---|---|---|
| 2004/0089928 | A1 | 5/2004 | Nakajima et al. |
| 2007/0108436 | A1* | 5/2007 | Sanmyo ............... H01L 33/62 257/13 |
| 2014/0117522 | A1* | 5/2014 | Lim ............... H01L 23/49575 257/675 |
| 2014/0367739 | A1 | 12/2014 | Muto et al. |
| 2015/0162808 | A1 | 6/2015 | Kato et al. |
| 2015/0318247 | A1 | 11/2015 | Kunimitsu et al. |

FOREIGN PATENT DOCUMENTS

| | | |
|---|---|---|
| JP | 2009-129952 A | 6/2009 |
| JP | 2015-002229 A | 1/2015 |
| JP | 2015-115966 A | 6/2015 |
| WO | 2014/174573 A1 | 10/2014 |

OTHER PUBLICATIONS

Communication dated Nov. 21, 2017 from the Japanese Patent Office in counterpart Japanese application No. 2016-196885.
Communication dated Jun. 12, 2018 issued by the Japanese Patent Office in counterpart Japanese application No. 2016-196885.

\* cited by examiner

MOLDED RESIN-SEALED POWER SEMICONDUCTOR DEVICE

BACKGROUND OF THE INVENTION

Field of the Invention

The present invention relates to a molded resin-sealed power semiconductor device formed by, for example, sealing with a molded resin.

Description of the Related Art

An existing general molded resin-sealed power semiconductor device is such that a semiconductor element and inner lead are soldered to a lead frame on which a catch portion is provided, and the whole is sealed with a molded resin. Cooling of the semiconductor element is essential, and the lead frame, including an external wire and the catch portion, needs to be isolated from a heatsink, because of which the lead frame is fixed across an insulating sheet to a projecting portion of the heatsink.

The semiconductor element and inner lead are reflow soldered to the lead frame, but as mounting is carried out on only one side, considerable deformation occurs due to thermal contraction when the rigidity of the lead frame is low. As the lead frame is corrected so as to be flat inside a molding die when molding, large stress due to the correction is generated in the semiconductor element and solder, and lifespan is shortened. The existing molded resin-sealed power semiconductor device is of a structure such that the rigidity of the lead frame is secured by the external wire portion and catch portion being held, whereby deformation in the vicinity of the semiconductor element due to soldering is prevented, stress generated when molding is eliminated, and lifespan shortening is prevented.

Also, a molded resin-sealed power semiconductor device disclosed in Patent Document 1 has a metal plate, which is a heatsink, to which a semiconductor element is soldered, and a lead frame, which is an external wire, and the semiconductor element and external wire are connected by an aluminum wire. As the aluminum wire has low rigidity and is soft, stress generated in the semiconductor element is reduced, and high reliability achieved, even when the lead frame is corrected so as to be flat when molding.

Patent Document 1: Japanese Patent No. 3,740,116

Normally, the lead frame is fabricated by a copper material of a constant thickness being pressed, and a surface of the lead frame opposite that on which the semiconductor element is mounted is exposed in order to increase cooling efficiency. Other than the exposed portion, the lead frame, including a molded resin (wire holding portion) for holding the external wire, can be isolated by molded resin, but as the exposed portion needs to be isolated, an insulating sheet is needed for attachment to the projecting portion of the heatsink. As the molded resin (wire holding portion) protrudes beyond the exposed surface of the lead frame, the external wire needs to be isolated by providing a step in the heatsink, and there is a problem in that restrictions occur in the heatsink manufacturing method and layout, and cost cannot be reduced.

Also, the structure of the existing molded resin-sealed power semiconductor device disclosed in Patent Document 1 is such that an allowable current value of the aluminum wire is low, because of which there is a problem in that multiple pieces of wire bonding are needed, and size and cost cannot be reduced.

SUMMARY OF THE INVENTION

The invention, having been contrived in order to resolve the heretofore described kinds of problem, has an object of providing a small, low-priced molded resin-sealed power semiconductor device.

A molded resin-sealed power semiconductor device according to the invention includes a power semiconductor element, a lead frame having a thick portion on which the power semiconductor element is mounted and a thin portion thinner than the thick portion, an inner lead that electrically connects the power semiconductor element and lead frame, and a molded resin that seals the power semiconductor element, lead frame, and inner lead.

According to the molded resin-sealed power semiconductor device according to the invention, freedom of layout increases, and a small, low-priced molded resin-sealed power semiconductor device can be obtained.

The foregoing and other objects, features, aspects, and advantages of the invention will become more apparent from the following detailed description of the invention when taken in conjunction with the accompanying drawings.

DETAILED DESCRIPTION OF THE PREFERRED EMBODIMENTS

First Embodiment

Figure 1:
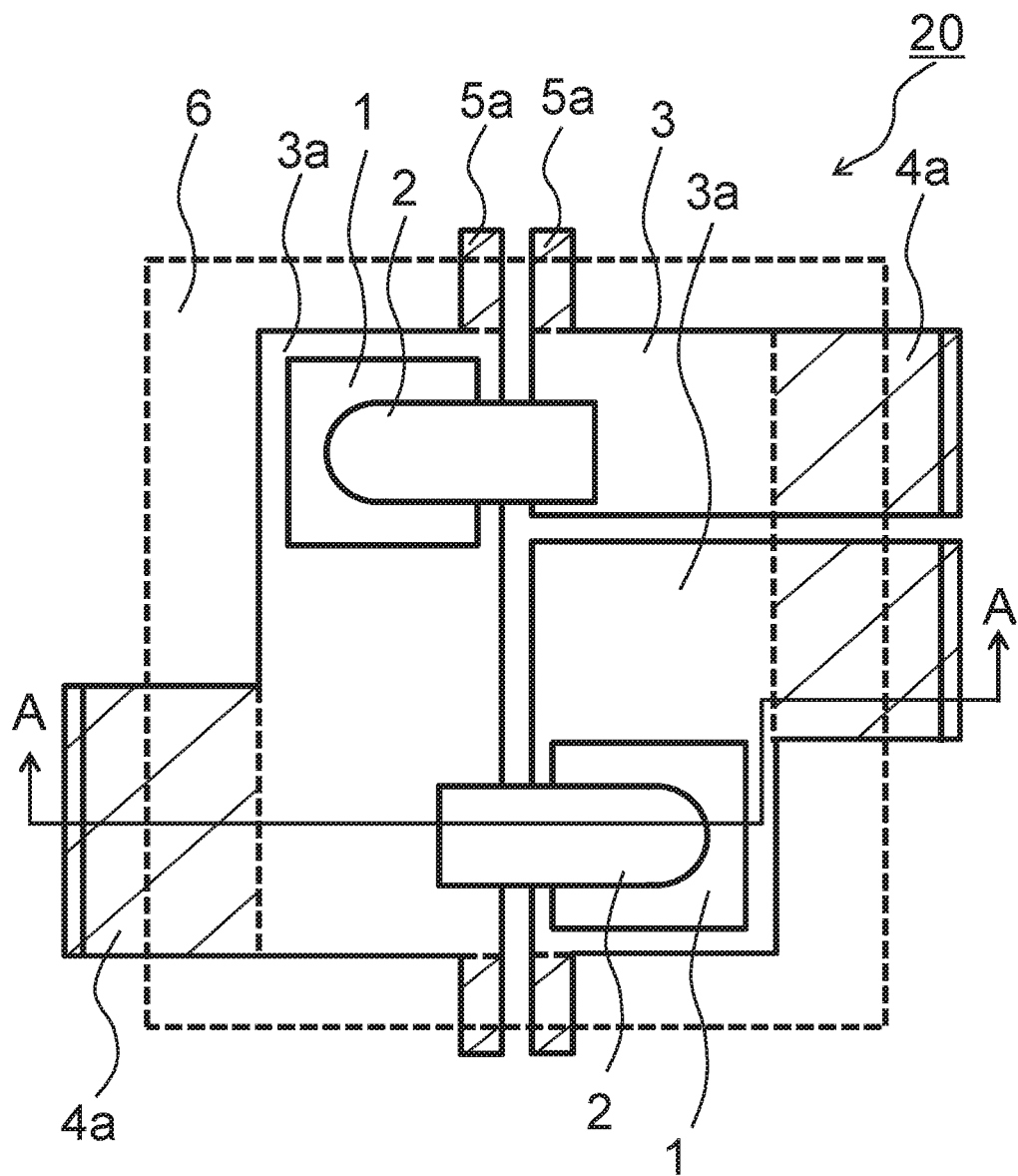
FIG. 1 is a plan view schematically showing a molded resin-sealed power semiconductor device according to a first embodiment of the invention.

Hereafter, based on the drawings, a first embodiment of the invention will be described. Identical reference signs in the drawings indicate identical or corresponding portions.

FIG. 1 is a plan view schematically showing a molded resin-sealed power semiconductor device according to the first embodiment of the invention. Also, FIG. 2 is a sectional view along an A-A line of the power semiconductor device in FIG. 1.

Figure 2:
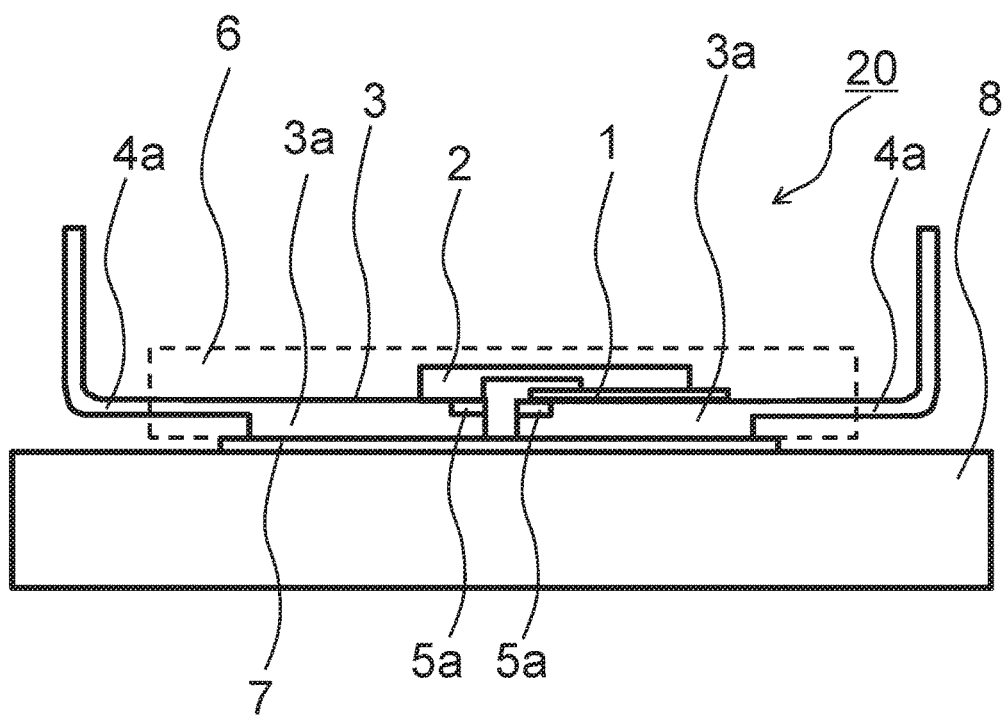
FIG. 2 is a sectional view along an A-A line of the molded resin-sealed power semiconductor device in FIG. 1.

In FIGS. 1 and 2, a power semiconductor device 20 includes a power semiconductor element 1 that carries out power conversion in accordance with a switching operation, a lead frame 3 in which the power semiconductor element 1 is mounted, an inner lead 2 that electrically connects an electrode (not shown) of the power semiconductor element 1 and an electrode (not shown) of the lead frame 3, and a molded resin 6 formed so as to seal the power semiconductor element 1, inner lead 2, and lead frame 3.

The lead frame 3, which has differing thicknesses, has a lead frame (thick portion) 3a formed in a central portion of the lead frame 3, an external wire (thin portion) 4a, which is a lead frame (thin portion) having a thickness less than that of the lead frame (thick portion) 3a, and a catch portion (thin portion) 5a, which is a lead frame (thin portion).

In FIGS. 1 and 2, the power semiconductor element 1 and inner lead 2 are soldered to the lead frame (thick portion) 3a, which provides the central portion of the lead frame 3 with thickness in a downward direction, and the whole is sealed by the molded resin 6. As cooling of the power semiconductor element 1 is essential, the lead frame 3, including the lead frame (thick portion) 3a, external wire (thin portion) 4a, and catch portion (thin portion) 5a, needs to be isolated from a heatsink 8. Therefore, the lead frame 3 is fixed across an insulating sheet 7 to the heatsink 8.

Specifically, film thicknesses of the external wire (thin portion) 4a and catch portion (thin portion) 5a are, for example, 0.5 to 0.8 mm, preferably 0.6 mm. Also, a film thickness of the lead frame (thick portion) 3a is, for example, 1.5 to 2 times the film thicknesses of the external wire (thin portion) 4a and catch portion (thin portion) 5a, preferably 1 mm.

In the first embodiment, by the central portion of the lead frame 3 being the lead frame (thick portion) 3a, which provides thickness in the downward direction, and the external wire (thin portion) 4a and catch portion (thin portion) 5a being formed to be thinner than the central portion of the lead frame 3, the external wire (thin portion) 4a and catch portion (thin portion) 5a exposed from the molded resin 6 can maintain an insulating distance from an upper surface of the heatsink 8, even in a structure wherein a surface of the lead frame (thick portion) 3a opposite to that on which the power semiconductor element 1 is mounted is exposed in order to increase cooling efficiency.

That is, the lead frame (thick portion) 3a has thickness in a direction from a surface of the lead frame (thick portion) 3a on which the power semiconductor element 1 is mounted toward the heatsink 8. Therefore, a configuration is such that a distance from a bottom surface of the external wire (thin portion) 4a or a bottom surface of the catch portion (thin portion) 5a to a surface of the heatsink 8 on which the lead frame 3 is mounted is greater than a distance from a bottom surface of the lead frame (thick portion) 3a to the surface of the heatsink 8 on which the lead frame 3 is mounted. As the exposed portion of the lead frame (thick portion) 3a needs to be isolated from the heatsink 8, the insulating sheet 7 is needed for attachment to the heatsink 8, but according to the first embodiment of the invention, there is no need to provide a stepped form in the heatsink 8, because of which a heatsink of an extruded aluminum material, pressed copper plate, or the like, with high thermal conductivity, that can be fabricated at low cost can be employed. Because of this, a reduction in size and reduction in cost can be realized, including also an increase in freedom of layout of the power semiconductor device 20 on the upper surface of the heatsink 8.

Deformation force generated in the catch portion (thin portion) 5a when soldering is the weight and thermal contraction force of the power semiconductor element 1 and inner lead 2, and rigidity decreases by the thickness of the catch portion (thin portion) 5a being reduced. However, the lead frame (thick portion) 3a itself in a vicinity of the power semiconductor element 1 has considerable leeway with respect to a deforming external force, because of which, by the lead frame (thick portion) 3a, which is the central portion of the lead frame 3, being held in four directions, those being the external wire (thin portion) 4a to the left and right and the catch portion (thin portion) 5a above and below, deformation in the vicinity of the power semiconductor element 1 due to soldering is prevented, stress generated when molding is eliminated, and high reliability can be obtained.

Also, the external wire (thin portion) 4a, which is the lead frame, and the catch portion (thin portion) 5a, which is the lead frame, are exposed to the exterior from side surfaces of the molded resin 6 in at least three of four directions (upper, lower, left, and right), and are held by the molded resin 6. For example, although there are also cases in which the external wire (thin portion) 4a is exposed on only one side rather than on the left and right, and cases in which the catch portion (thin portion) 5a is disposed in only one direction, deformation cannot be prevented when places in only two directions are held by the molded resin 6.

A material of a constant thickness is used as a material of the lead frame 3, and the lead frame (thick portion) 3a can be fabricated by a thin portion being cut by machining. Also, by a variant rolled material, variant extruded material, or the like, whose central portion is provided with thickness in the downward direction being used as a material of the lead frame 3, a low-priced material of an arbitrary cross-sectional form with high dimensional accuracy can be selected. Furthermore, provided that a form in a planar direction of the catch portion (thin portion) 5a is of a reduced size, the thickness of the catch portion (thin portion) 5a can be reduced by pressing, because of which the whole of the lead frame 3 can be fabricated by pressing alone, and a reduction in cost can be realized.

Figure 3:
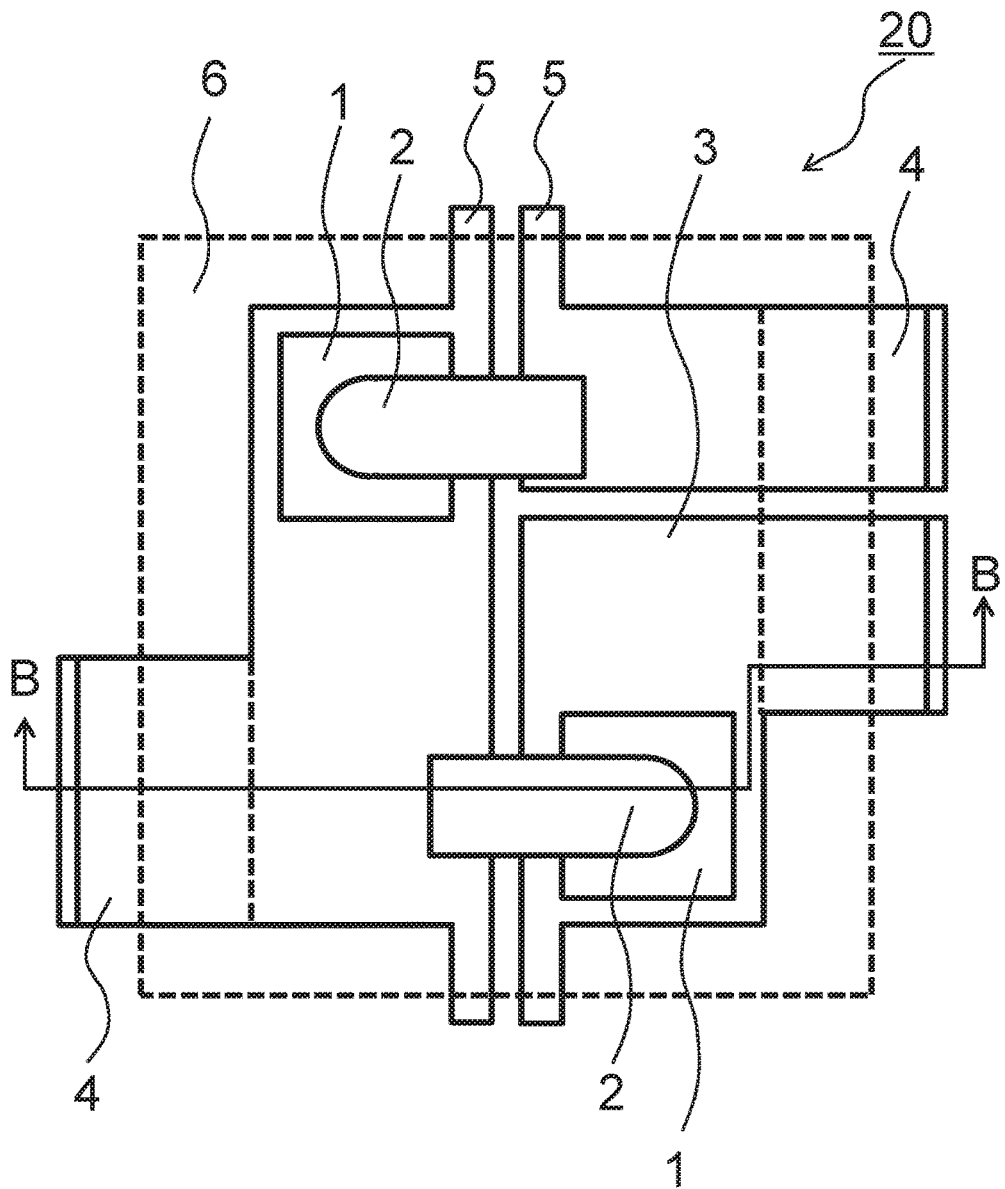
FIG. 3 is a plan view schematically showing a molded resin-sealed power semiconductor device according to a comparison example.
Figure 4:
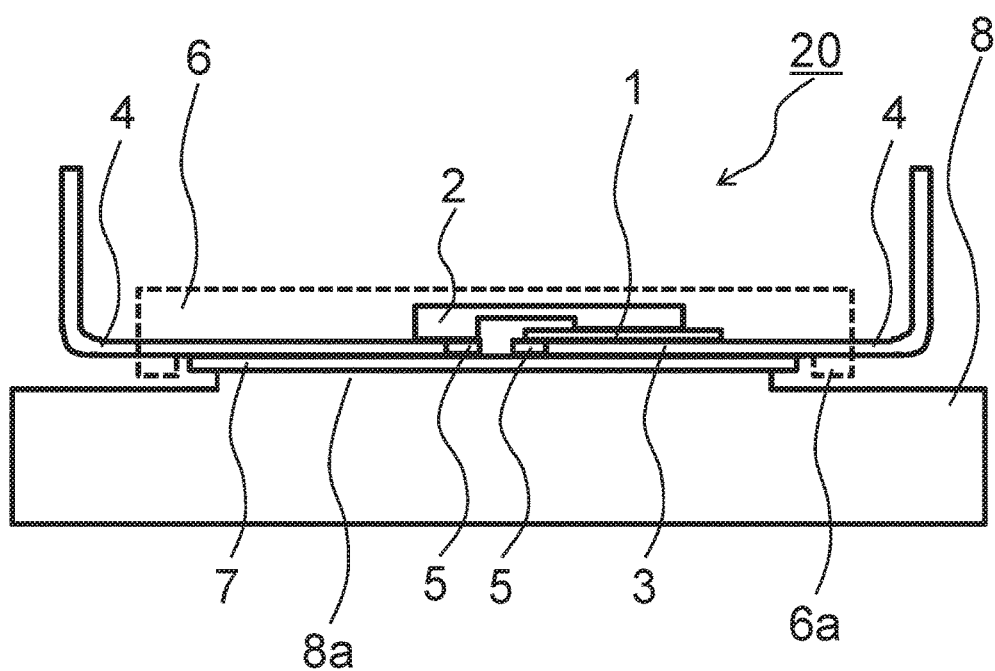
FIG. 4 is a sectional view along a B-B line of the molded resin-sealed power semiconductor device in FIG. 3.

Meanwhile, FIG. 3 is a plan view schematically showing a power semiconductor device according to a comparison example, and FIG. 4 is a sectional view along a B-B line of the power semiconductor device in FIG. 3.

Herein, using FIGS. 3 and 4, an existing power semiconductor device 20 will be described as a comparison example. In FIGS. 3 and 4, the power semiconductor element 1 and inner lead 2 are soldered to the lead frame 3 on which a catch portion 5 is provided, and the whole is sealed by the molded resin 6. As cooling of the power semiconductor element 1 is essential, the lead frame 3, including an external wire portion 4 and the catch portion 5, needs to be isolated from the heatsink 8, because of which the lead frame 3 is fixed across the insulating sheet 7 to a projecting portion 8a of the heatsink 8.

The power semiconductor element 1 and inner lead 2 are reflow soldered to the lead frame 3, but as mounting is carried out on only one side, considerable deformation occurs due to thermal contraction when the rigidity of the lead frame 3 is low. As the lead frame 3 is corrected so as to be flat inside a molding die when molding, large stress due to the correction is generated in the power semiconductor element 1 and solder, and lifespan is shortened.

The molded resin-sealed power semiconductor device in the comparison example is of a structure such that the rigidity of the lead frame 3 is secured by the external wire portion 4 and catch portion 5 being held, whereby deformation in the vicinity of the power semiconductor element 1 due to soldering is prevented, stress generated when molding is eliminated, and lifespan shortening is prevented.

Normally, the lead frame 3 is fabricated by a copper material of a constant thickness being pressed, and a surface of the lead frame 3 opposite to that on which the power semiconductor element 1 is mounted is exposed in order to increase cooling efficiency. Other than the exposed portion, the lead frame 3, including a molded resin (wire holding portion) 6a for holding the external wire portion 4, can be isolated by the molded resin 6, but as the exposed portion needs to be isolated, the insulating sheet 7 is needed for attachment to the projecting portion 8a of the heatsink 8. In the comparison example, the molded resin (wire holding portion) 6a protrudes beyond the exposed surface of the lead frame 3, because of which the external wire portion 4 needs to be isolated by providing a step in the heatsink 8, and there is a disadvantage in that restrictions occur in the heatsink 8 manufacturing method and the layout of the power semiconductor element 1, and cost cannot be reduced.

However, the molded resin-sealed power semiconductor device according to the first embodiment of the invention is such that there is no need to provide a stepped form in the heatsink 8, because of which a heatsink of an extruded aluminum material, pressed copper plate, or the like, with high thermal conductivity, that can be fabricated at low cost can be employed. Because of this, a reduction in size and reduction in cost can be realized, including also an increase in freedom of layout of the power semiconductor device 20 on the upper surface of the heatsink 8.

In the first embodiment, the individual insulating sheet 7 is used for insulation, but the back surface of the molded resin-sealed power semiconductor device can be provided with an insulating function by integrally molding the insulating sheet 7 when molding the molded resin, sealing with the molded resin 6 as far as the back surface of the lead frame (thick portion) 3a when molding the molded resin, or the like, whereby ease of assembly with the heatsink 8 can be increased, and a further reduction in cost can be realized.

Various modifications and alterations of the invention will be apparent to those skilled in the art without departing from the scope and spirit of the invention, and it should be understood that this is not limited to the illustrative embodiments set forth herein.

What is claimed is:

1. A molded resin-sealed power semiconductor device, comprising:
    a power semiconductor element;
    a lead frame having a thick portion on which the power semiconductor element is mounted and a thin portion thinner than the thick portion;
    an inner lead that electrically connects the power semiconductor element and the lead frame; and
    a molded resin that seals the power semiconductor element, lead frame, and inner lead,
    wherein the thin portion of the lead frame is formed in four directions of the thick portion and exposed to an exterior in four directions from side surfaces of the molded resin in a state sealed by the molded resin,
    wherein the thick portion is held by the thin portion formed in four directions.

2. The molded resin-sealed power semiconductor device according to claim 1, wherein the thin portion of the lead frame is an external wire for connecting to the exterior or a catch portion.

3. The molded resin-sealed power semiconductor device according to claim 1, further comprising
    a heatsink that does not have a step, wherein
    the lead frame is mounted on an upper surface of the heatsink across an insulating sheet, and
    the thick portion of the lead frame has thickness in a direction from a surface on which the power semiconductor element is mounted toward the heatsink side.

4. The molded resin-sealed power semiconductor device according to claim 1, wherein the thickness of the thick portion of the lead frame is 1.5 to 2 times the thickness of the thin portion of the lead frame.

5. The molded resin-sealed power semiconductor device according to claim 1, further comprising
    a heatsink on which the lead frame is mounted,
    wherein a distance from a bottom surface of the thin portion of the lead frame to a surface of the heatsink on which the lead frame is mounted is greater than a distance from a bottom surface the thick portion of the lead frame to the surface of the heatsink.

6. The molded resin-sealed power semiconductor device according to claim 1, wherein the lead frame is a single piece of material and the thin portion of the lead frame is formed by cutting a portion of the material or by pressing the material in thickness direction.

* * * * *